United States Patent [19]

Seri et al.

[11] Patent Number: 5,994,877

[45] Date of Patent: Nov. 30, 1999

[54] METHOD FOR DETECTING WORKING CONDITION OF NON-AQUEOUS ELECTROLYTE SECONDARY BATTERIES

[75] Inventors: Hajime Seri, Izumiotsu; Yoshinori Yamada, Tondabayashi; Kenichi Takeyama, Osaka; Teruhisa Kanbara, Ikeda, all of Japan

[73] Assignee: Matsushita Electric Industrial Co., Ltd., Osaka-Fu, Japan

[21] Appl. No.: 09/103,982

[22] Filed: Jun. 24, 1998

[30] Foreign Application Priority Data

Jun. 24, 1997 [JP] Japan .................................. 9-167499
Jun. 24, 1997 [JP] Japan .................................. 9-167502
Jun. 26, 1997 [JP] Japan .................................. 9-169836

[51] Int. Cl.$^6$ .................................................. H01M 10/44
[52] U.S. Cl. ........................................... 320/132; 320/136
[58] Field of Search .................................... 320/128, 129, 320/130, 131, 132, 133, 135, 136, DIG. 21; 324/426, 432, 433

[56] References Cited

U.S. PATENT DOCUMENTS 5,148,043  9/1992  Hirata et al. ............................... 307/66
5,404,106  4/1995  Matsuda .................................. 324/431
5,483,165  1/1996  Cameron et al. ........... 320/DIG. 21 X
5,606,240  2/1997  Kokuga et al. .......................... 320/129

FOREIGN PATENT DOCUMENTS 7-098367  4/1995  Japan .
8-055642  2/1996  Japan .
9-033620  2/1997  Japan .

Primary Examiner—Edward H. Tso
Attorney, Agent, or Firm—Akin, Gump, Strauss, Hauer & Feld, L.L.P.

[57] ABSTRACT

The present invention provides methods for detecting a working condition of a non-aqueous electrolyte secondary battery which allow easy and accurate determination of the degree of degradation and remaining capacity of the non-aqueous electrolyte secondary battery by a simple test irrespective of the past charging and discharging history of the battery. In the methods of the present invention, the degree of degradation of battery is quantitatively determined on the basis of the voltage value in charging or discharging at a constant current, or from an equation with that voltage value as variable.

8 Claims, 14 Drawing Sheets

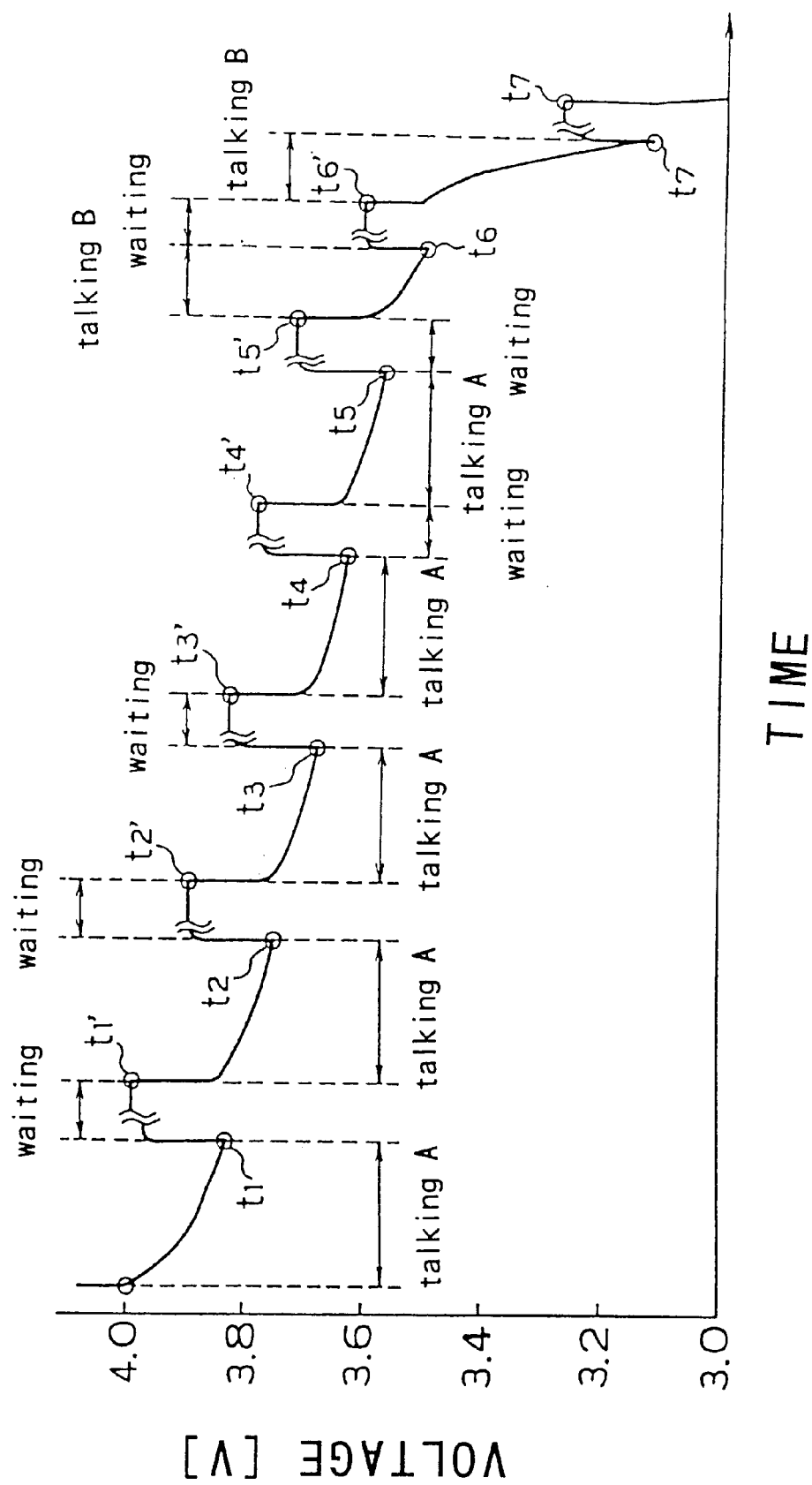

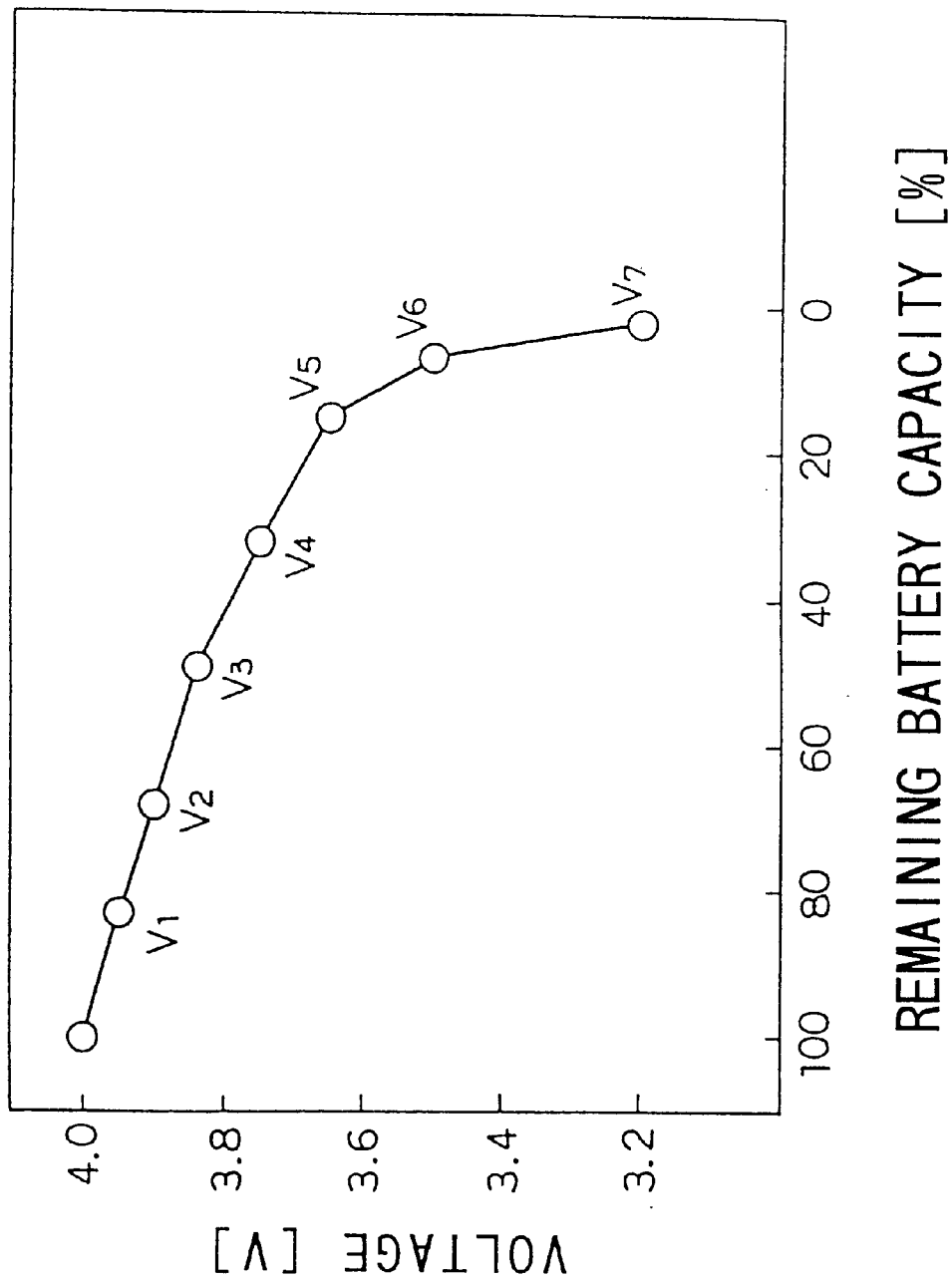

METHOD FOR DETECTING WORKING CONDITION OF NON-AQUEOUS ELECTROLYTE SECONDARY BATTERIES

BACKGROUND OF THE INVENTION

The present invention relates to a method for detecting the working condition of batteries which is applicable to non-aqueous electrolyte secondary batteries such as lithium ion secondary batteries. More particularly, the present invention relates to a method for determining a degree of degradation and a remaining capacity of battery.

Portable electronic appliances like notebook-sized personal computers and cellular phones which run on high-capacity secondary batteries are fast growing in recent years. The appliance is usually provided with a remaining battery capacity meter which indicates a remaining serviceable time of the battery to the operator.

A performance of a secondary battery which drives the electronic appliance falls inevitably as a charge/discharge cycle is repeated. But such degradation in performance of battery is indicated to the operator on very few of those electronic appliances. The operator somehow notes a deterioration in performance of battery only from a feeling that the serviceable time of the equipment is getting short.

There have been disclosed a number of methods of detecting the degree of deterioration in performance of secondary battery, which can be classified roughly into:

(1) measuring an internal impedance of a battery, (2) measuring internal impedances of a battery at plural alternating currents with different frequencies, and substituting these values into a predetermined arithmetic equation, (3) measuring an electric resistance of an active material of a battery that is a constituent element of the battery, (4) detecting a voltage of a battery while charging or discharging it at a constant current, and comparing the obtained value with the predetermined reference value, and (5) counting the number of charge/discharge cycles.

Many methods for detecting the degradation in performance of secondary battery have been proposed as mentioned above. But the progress of the degradation in performance of secondary battery is much different depending on its application condition, that is the charging and discharging currents, charging and discharging voltages, and charging and discharging times. There is much difference in degree of degradation between a battery which has subjected to a repetition of a shallow charge/discharge cycle and another which has been subjected to a repetition of a deep charge/discharge cycle even if the numbers of both cycles are same. Therefore, it is difficult to digitize the degree of degradation by any of those methods including the one that simply counts the number of charge/discharge cycles.

On the other hand, some methods for detecting the remaining capacity of secondary battery are now adopted on portable equipments. Those methods are essentially classified into the following two methods:

One is a direct method in which a determination is made merely from a measurement of battery voltage. This is widely used in cellular phones. The detection apparatus for this direct method is relatively low in manufacturing cost but the method involves a shortcoming of low detection accuracy. When an electronic appliance is in operation, the battery voltage always fluctuates depending on an operating mode of the appliance. Therefore, measurement errors will be large if the remaining capacity of battery is determined simply based on the battery voltage with the appliance in operation regardless of any consideration to the operating mode. In the portable electronic appliance such as a cellular phone, the remaining capacity display by this method employs a three- or four-stage lighting system using LED with one end being fully charged condition and the other being empty condition.

The other is an indirect method in which an information of an integrated charging current value is stored on a memory and discharging current value is deducted from the integrated charging current value as the battery discharges. This system is widely employed on notebook-sized personal computers. The indirect method is high in accuracy and can show the remaining capacity in minutes. However, this method needs the memory to store the information of the integrated current value, which pushes up the costs of appliance.

Further, other ideas are also proposed. Among them are methods for detecting the remaining capacity by measuring a voltage drop of battery at pulse-discharging, by utilizing recovery characteristics of battery voltage after pulse-discharging, by measuring a capacitance of battery, or by measuring an impedance at a specific frequency then calculating the remaining capacity from the ratio of the real number component to the imaginary number component of the impedance or a calculation using the imaginary number component and the frequency.

BRIEF SUMMARY OF THE INVENTION

It is an object of the present invention to provide a method for detecting a working condition of a non-aqueous electrolyte secondary battery which is applicable to small-sized electronic appliances like a cellular phone.

Non-aqueous electrolyte secondary batteries exhibit a common behavior in the deterioration of output current rate characteristics irrespective of the current-discharging mode as long as the manufacturer's recommended charging conditions and discharging cut-off voltage are observed. In the present invention, the degradation of battery can be quantitatively detected by measuring the output current rate characteristics.

The present invention provides a method for detecting a working condition of a non-aqueous electrolyte secondary battery, wherein the degree of degradation of the battery is quantitatively determined on the basis of a voltage value of the battery which is in charging or discharging at a constant current.

In a preferred mode of the present invention, the non-aqueous electrolyte secondary battery is charged or discharged on a plurality of constant currents respectively, and the voltage of the battery is measured for each constant current. Then, a relational expression between the voltage and current is worked out by regression analysis on the basis of the voltage and current values thus obtained. Using this relational expression, quantitative determination is made of the degree of degradation of the battery.

For example, the degree of degradation of non-aqueous electrolyte secondary battery is determined in the following way.

The difference $\Delta V$ between the battery voltage $V$ in charging or discharging at a constant current and the initial voltage $V_o$ can be represented by the following quadratic function with the current value "i" as variable.

$$\Delta V = (V - V_o) = ai^2 + bi + c \qquad (1)$$

The decrease in magnitude of the coefficient "a" is proportional to the drop in capacity which is caused by the deterioration of the non-aqueous electrolyte secondary battery. So, the degree of degradation of the battery is determined on the basis of the coefficient "a". When, for example, this parameter "a" is inputted in the following equation, the discharge capacity $C_a$ at the moment can be estimated irrespective of the past charging and discharging history.

$$C_a = K_1 - ak_2 \qquad (2)$$

where $C_a$ is a discharge capacity, and $K_1$ and $k_2$ are predetermined characteristic values of the battery. On the basis of thus obtained discharge capacity $C_a$, it is possible to make a consistent and quantitative determination of the degree of degradation of the battery.

What is to be noted here is that the coefficient "a" for a battery which has not undergone charge/discharge cycles is very large but the coefficient "a" will gradually decrease with the repetition of charge/discharge cycle. That is to say, in new batteries, the current value and the polarization voltage are roughly proportional with each other, but the polarization voltage to the current value accelerates with the repetition of the charge/discharge cycle.

The aforementioned detection of the degree of degradation can be effected in the following arrangement, for example.

A constant current discharger (or a constant current charger), a voltage detector and an arithmetic unit are provided to the appliance. The constant current discharger discharges a non-aqueous electrolyte secondary battery at currents of 0.1 A, 0.5 A, 1 A, 2 A and 3 A for one second, respectively, for example. The voltage detector detects each voltage of the battery at a point of one second after the start of discharging. In a case the constant current charger is used in place of the constant current discharger, charging will be effected at the same rate. The arithmetic unit calculates the decreased (or increased) amount $\Delta V$ in voltage from the initial level. Then, approximate expression of equation (1) which fits for the obtained values is calculated. The coefficient "a" obtained from that is substituted into the prerecorded equation (2), then the discharge capacity $C_d$ is calculated. In this process, no restriction in particular is placed on the fitting algorithm for calculation of the coefficient "a", and the known techniques such as the least square method can be used.

In another preferred mode of the present invention, the degree of degradation of the non-aqueous electrolyte secondary battery is determined quantitatively on the basis of the time T needed for the battery voltage to reach a specific value when the battery is charged or discharged at a large current.

With the nominal one hour-rate capacity of the battery as C mAh, it is desired that the current value in charging or discharging be not lower than 5C mA. In the case of the battery systems like a lithium secondary battery employing an organic electrolyte with a low ionic conductivity, the battery with larger decrease in capacity due to the repetition of charge/discharge cycle exhibits larger voltage drop when the battery discharges at an unusually large current. In addition, the amount of voltage drop is in inverse proportion to the discharge capacity of the battery. In charging of such batteries, the voltage rise becomes greater with the repetition of charge/discharge cycle.

Even if different current modes have been used in charge/discharge cycle, the degree of deterioration of battery due to the repetition of charge/discharge cycle can be detected when a battery is charged or discharged in an almost unusually large current and the change in voltage is used as a parameter for judging the degree of deterioration.

From the time T required for the battery voltage to reach a specific value, it is possible to judge the degree of capacity drop of the battery. The discharge capacity $C_b$ of the battery at the moment can be detected irrespective of the past charging and discharging history, if, for example, the time T thus obtained is substituted into the following equation:

$$C_b = \sum_{i=1}^{n} k_i \times T^i \qquad (3)$$

where i is 1, 2 . . . n , $k_i$ is an characteristic value predetermined by the current value, cut-off voltage and type of battery, for example.

On the basis of thus obtained discharge capacity $C_b$, the degree of deterioration of the secondary battery can be determined consistently and quantitatively.

The aforementioned detection of the degree of degradation can be made in the following arrangement, for example.

A constant current discharger (or a constant current charger), a measuring unit and an arithmetic unit are provided to the equipment. The constant current discharger makes the battery discharge at a constant current of 5 A. The measuring unit measures the time T needed for the battery voltage to drop to 1 V, for example, while measuring the battery voltage. It can be considered that the smaller the value T, larger the battery deterioration. The arithmetic unit calculates the discharge capacity of the battery by substituting this value T into a polynomial on T as variable, for example, the aforementioned equation (3). In a case the constant current charger is used in place of the constant current discharger, the discharge capacity of the battery can be worked out in the same way by using the time required for the battery voltage to reach a predetermined voltage value higher than the initial voltage value.

In still another preferred mode of the present invention, the remaining capacity of the non-aqueous electrolyte secondary battery is detected on the basis of the closed circuit voltage measured when the battery is charged or discharged at a constant current for a specific time.

By collating thus obtained closed circuit voltage with a prerecorded battery voltage-remaining capacity correlation table, it is possible to detect the remaining capacity of the battery with high accuracy using a simple detector arrangement without an integrating system.

With the nominal capacity of the non-aqueous electrolyte battery as C mAh, it is desired that the current value in detecting the remaining capacity be not higher than C/5 mA.

The aforementioned remaining capacity is estimated in the following way, for example.

A constant current discharger (or a constant current charger), a voltage detector and an arithmetic unit are provided to the appliance. The constant current discharger makes the battery discharge at a constant current value of 70 mA for 5 seconds. The voltage detector measures the closed circuit voltage of the battery at the moment. The arithmetic unit estimates the remaining capacity by collating the obtained voltage value with a prepared remaining capacity-battery voltage correlation table. The remaining capacity-battery voltage correlation table can be prepared from a constant current (70 mA) discharging curve of the battery.

It is noted that larger the discharging current, greater the drop with time in closed circuit voltage. Therefore, the remaining capacity of battery can be estimated with considerable accuracy by only discharging the battery at a relatively large current and measuring the closed circuit voltage at that time. Larger the current value, more accurate the information obtained on the remaining capacity. But if a battery in the final discharging stage is discharged at a very large current, the battery voltage will drop so much that there is a possibility that the appliance in use will fail proper operation. It is necessary, therefore, to decide on the proper current value with consideration given to the power consumption of the appliance in operation and the discharge voltage characteristics of the battery. It is also feasible to estimate the discharge capacity in the same way by charging the battery at a large current and measuring the voltage increase at that time.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE SEVERAL VIEWS OF THE DRAWING

FIG. 13 is a diagram showing the discharge modes of the same battery.

FIG. 14 is a diagram showing a relation between the voltage and the remaining capacity of the same battery.

DETAILED DESCRIPTION OF THE INVENTION

Now, the method for detecting the working condition of batteries according to the present invention will be illustrated in detail by examples with reference to the drawings.

EMBODIMENT 1

In the present embodiment, there will be explained the method which can determine the drop in capacity of non-aqueous electrolyte secondary batteries due to the degradation even if the batteries have been subjected to different charging and discharging conditions. The determination is made on the basis of a decreased amount in output voltage of the battery observed when the battery is discharged at a constant current.

In the present embodiment, experiments were carried out with lithium ion batteries manufactured by Matsushita Electric Industrial Co., Ltd. (Model CGR17500; recommended upper cut-off voltage 4.1 V, lower cut-off voltage 3.0 V; nominal discharge capacity 720 mAh). The Ibatteries were put to charge/discharge cycle tests under different discharging conditions given in TABLE 1. The battery voltage was measured before the test and after 300 cycles, 500 cycles and 700 cycles, respectively.

TABLE 1

| process | discharge current [mA] | lower cut-off voltage [V] |
|---|---|---|
| A | 140 | 3.0 |
| B | 350 | 3.0 |
| C | 700 | 3.0 |

1-1. Battery charge/discharge cycle test

The batteries were charged for a total of two hours according to the recommended charging procedure for the batteries of this type (a constant current-constant voltage charging) in which a constant current of 500 mA was applied to the batteries up to 4.1 V, then a current is applied so as to maintain this voltage. In discharging, on the other hand, three different current modes A, B or C were applied. With all the batteries, the discharging was stopped at 3.0 V. The tests were all carried out in a thermostat maintained at 20° C. The results are shown in FIG. 1.

Figure 1:
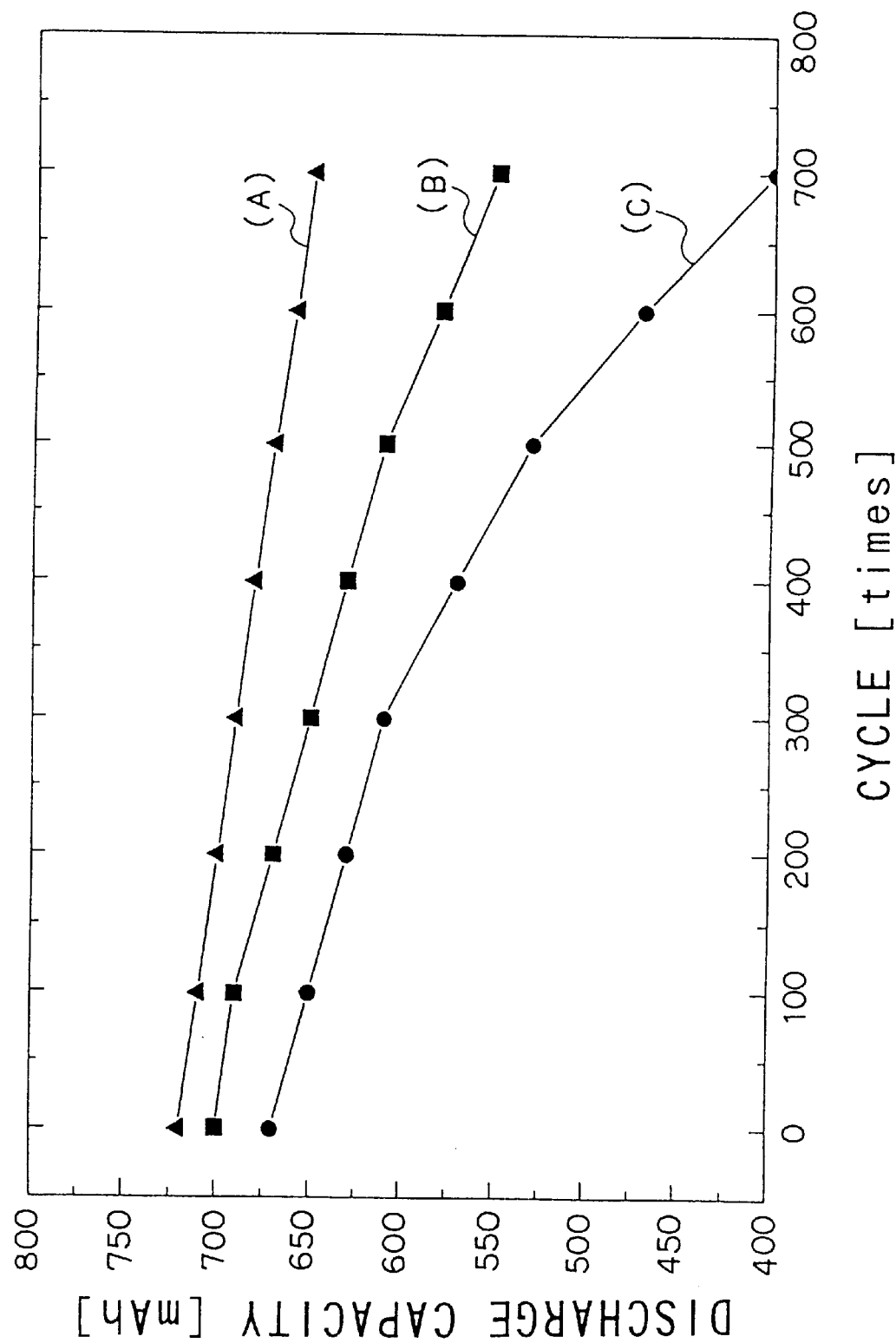
FIG. 1 shows characteristic curves illustrating the changes in discharge capacity during repetition of charge/discharge cycles of a lithium ion secondary battery used in an embodiment of the present invention.

In FIG. 1, the axis of ordinate indicates the discharge capacity and the axis of abscissa denotes the number of charge/discharge cycles. As is evident from FIG. 1, a degree of degradation in discharge capacity is different depending on the discharging current value.

1-2. Measurement of Degradation Parameter

Figure 2:
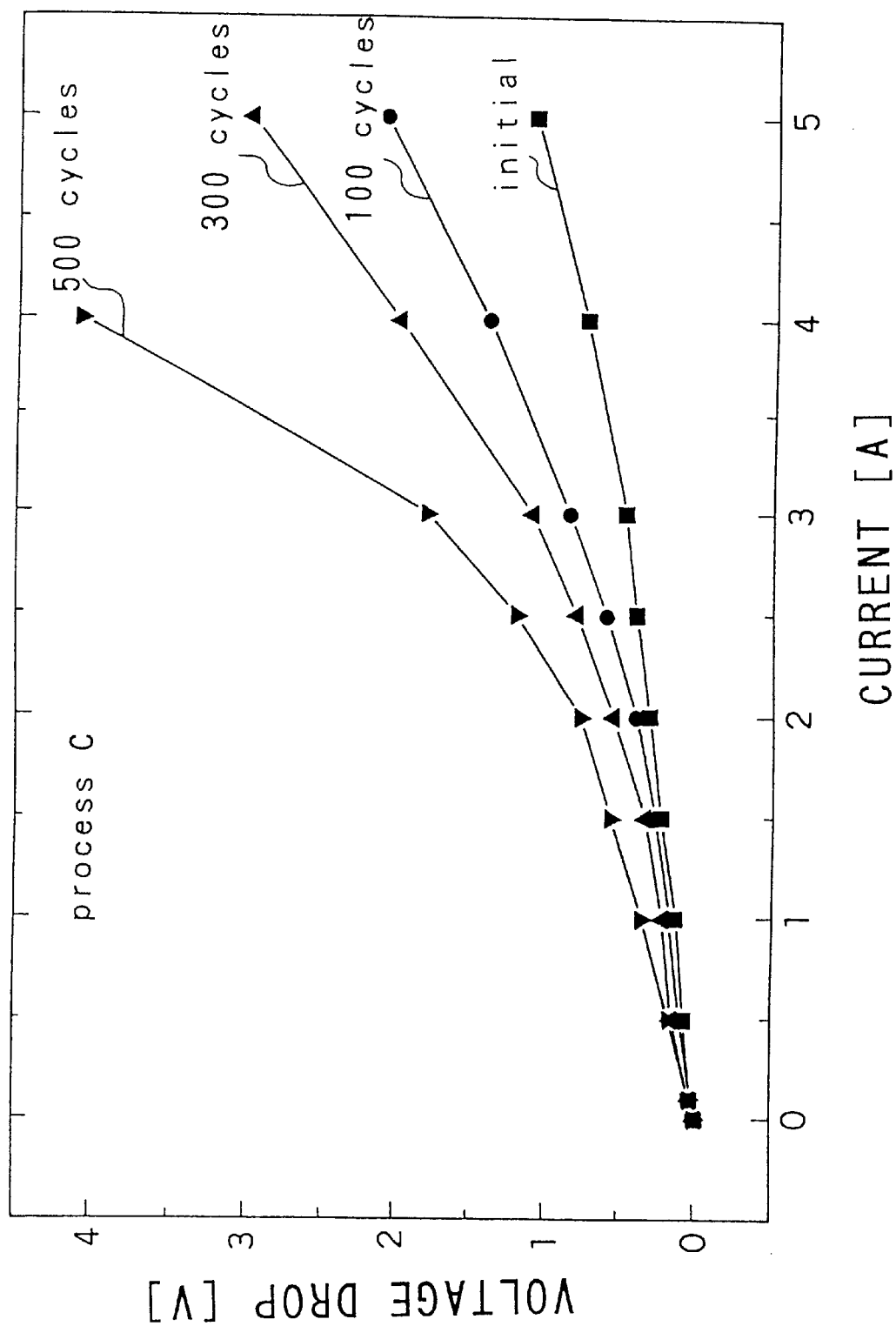
FIG. 2 shows characteristic curves illustrating relationships between the current values and voltage drops of the battery discharged in process C in the same embodiment.

Thus charged batteries were discharged continuously for one second at 0.1 A, 0.5 A, 1 A, 2 A, 2.5 A, 3 A, 4 A and 5 A, respectively, before being subjected to the charge/discharge cycle, after 300 cycles and after 500 cycles of charge/discharge according to process C in TABLE 1. After each one second-discharging, measurements were taken of the voltage drop from the level measured upon completion of charging. The results are shown in FIG. 2. As is clear from FIG. 2, the voltage drop increases gradually with the repetition of charge/discharge cycle even if the same current is applied. Following is a quadratic function as a relational expression between the amount of voltage drop and the current value calculated by a regression analysis using the data obtained:

$$\Delta V = ai^2 + bi + c$$

where ΔV is an amount of voltage drop and i is a current value.

Coefficients "a", "b" and "c" of the calculated relational expression are enumerated in Table 2.

TABLE 2

| discharge current [A] | amount of voltage drop [V] | | | |
| --- | --- | --- | --- | --- |
| | 0 | 100 cycles | 300 cycles | 500 cycles |
| 0.1 | 0.02 | 0.02 | 0.03 | 0.03 |
| 0.5 | 0.07 | 0.10 | 0.15 | 0.17 |
| 1.0 | 0.13 | 0.17 | 0.22 | 0.36 |
| 1.5 | 0.23 | 0.27 | 0.34 | 0.57 |
| 2.0 | 0.31 | 0.40 | 0.55 | 0.77 |
| 2.5 | 0.40 | 0.60 | 0.80 | 1.2 |
| 3.0 | 0.47 | 0.85 | 1.1 | 1.8 |
| 4.0 | 0.75 | 1.4 | 2.0 | 4.1 |
| 5.0 | 1.1 | 2.1 | 3.0 | — |
| a | 0.025 | 0.072 | 0.11 | 0.31 |
| b | 0.089 | 0.058 | 0.030 | −0.29 |
| c | 0.015 | 0.021 | 0.044 | 0.14 |
| Capacity [mAh] | 670 | 650 | 610 | 530 |

Figure 3:
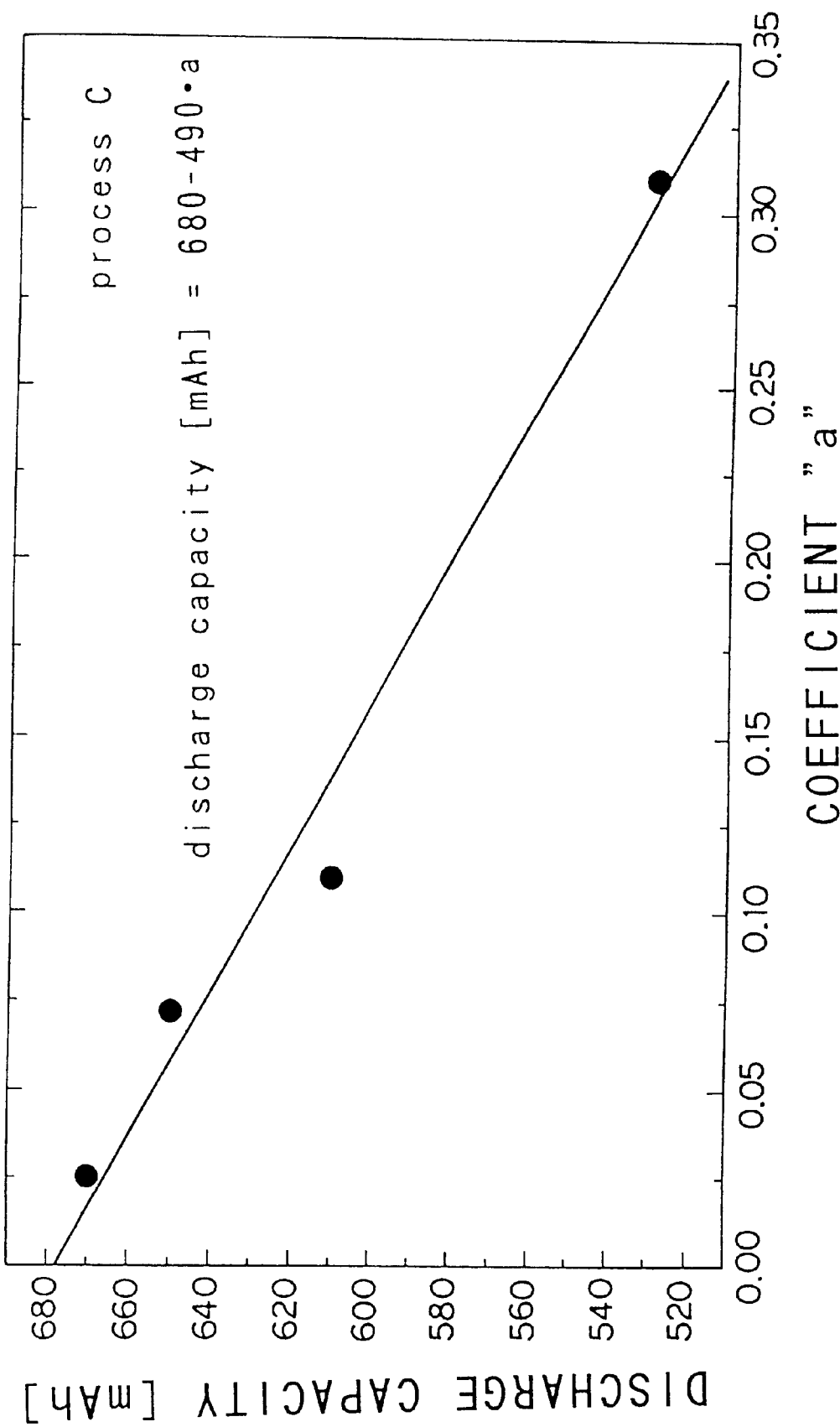
FIG. 3 shows a characteristic curve illustrating a relationship between parameter "a" and discharge capacity of the same battery.

Plotted in FIG. 3 is the relationship between the parameters "a" and discharge capacities obtained at the respective cycles. As shown in FIG. 3, the four points plotted are roughly on a straight line. Approximated by the least square method, the discharge capacity C is expressed in the following linear equation with the parameter "a" as variable:

$$C [mAh] = 680 - 490 \times a.$$

Figure 4:
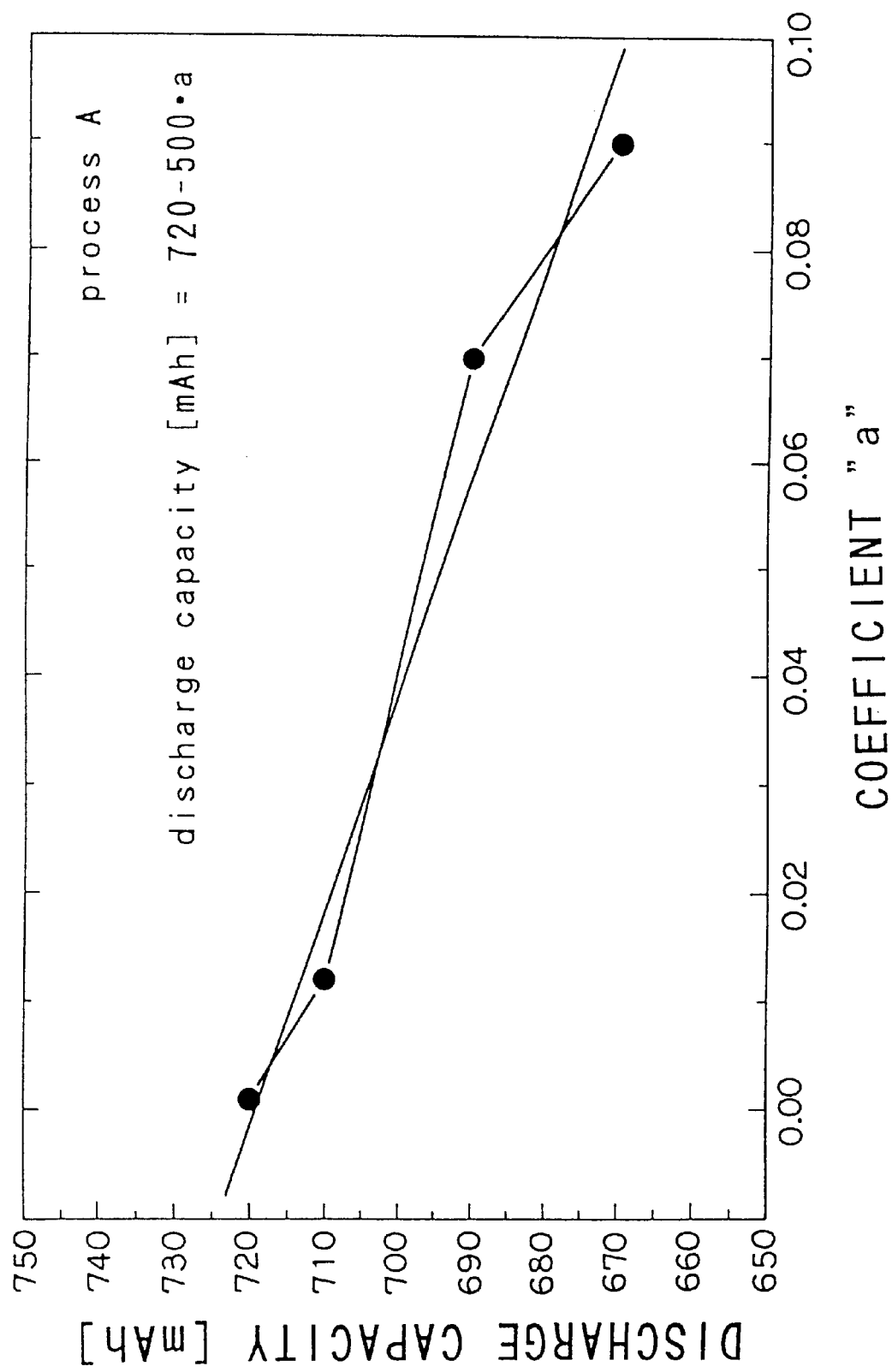
FIG. 4 shows a characteristic curve illustrating a relationship between the parameter "a" and discharge capacity of the battery discharged in process A in the same embodiment.
Figure 5:
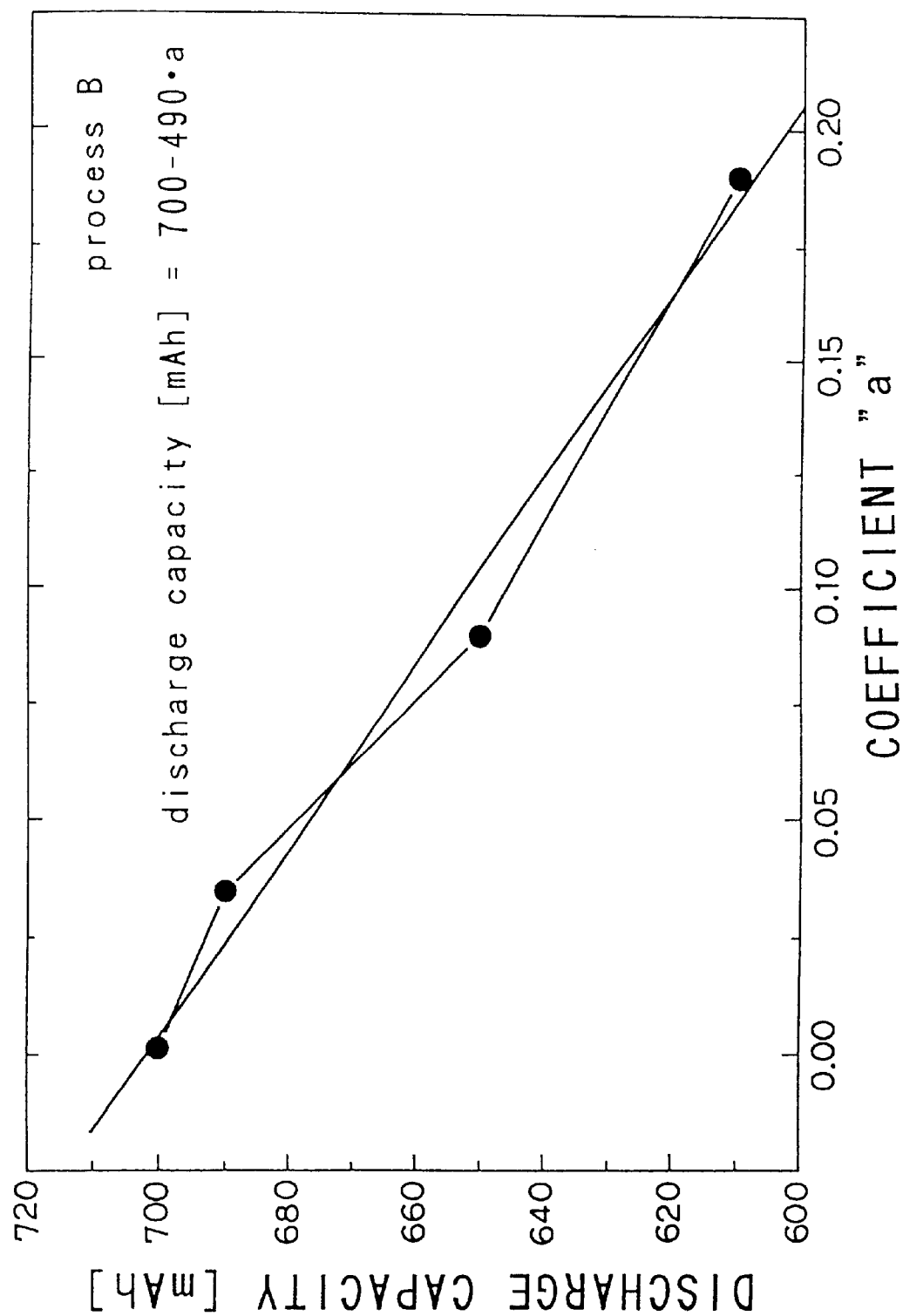
FIG. 5 shows a characteristic curve illustrating a relation between the parameter "a" and discharge capacity of the battery discharged in process B in the same embodiment.

The batteries discharged according to process A and process B were examined in the same way, and the parameters "a" were worked out. The results are shown in FIG. 4 and FIG. 5.

The discharge capacity usually differs greatly depending on the current value. It is also pointed out that the batteries are naturally different in the degree of degradation depending on the charging and discharging conditions after the repetition of charge/discharge cycle. It is apparent from a combination of FIGS. 3, 4 and 5, however, the discharge capacity C of the batteries can be estimated from an equation incorporating the actual measurement of the initial discharging current and parameter "a" in the present embodiment as follows, even if the batteries have been undergone charge/discharge cycles under different discharging conditions:

$$C [mAh] = \text{initial capacity} - 500 \times a.$$

Needless to say, the above equation is applicable only to lithium ion batteries of the type used in the present embodiment. But the parameter "a" can be worked out similarly for different types of lithium ion batteries and other non-aqueous electrolyte secondary batteries. From the parameter "a", it is possible to estimate the performance of battery at the moment.

EMBODIMENT 2

The present embodiment will illustrate an example of the method for quantitatively determining the degree of degradation of a non-aqueous electrolyte secondary battery on the basis of the time T required for the battery voltage to reach a specific value when the battery is charged or discharged at a large current. In this embodiment, lithium ion batteries of the same model used in Embodiment 1 were used.

Charging and discharging according to process C was repeated. Before the repetition of the charge/discharge cycle and after 100, 300, 500 and 700 cycles, the batteries were discharged in a constant current of 4.9 A and the voltage drop behavior of battery at that time was examined. The results are shown in FIG. 6.

Figure 6:
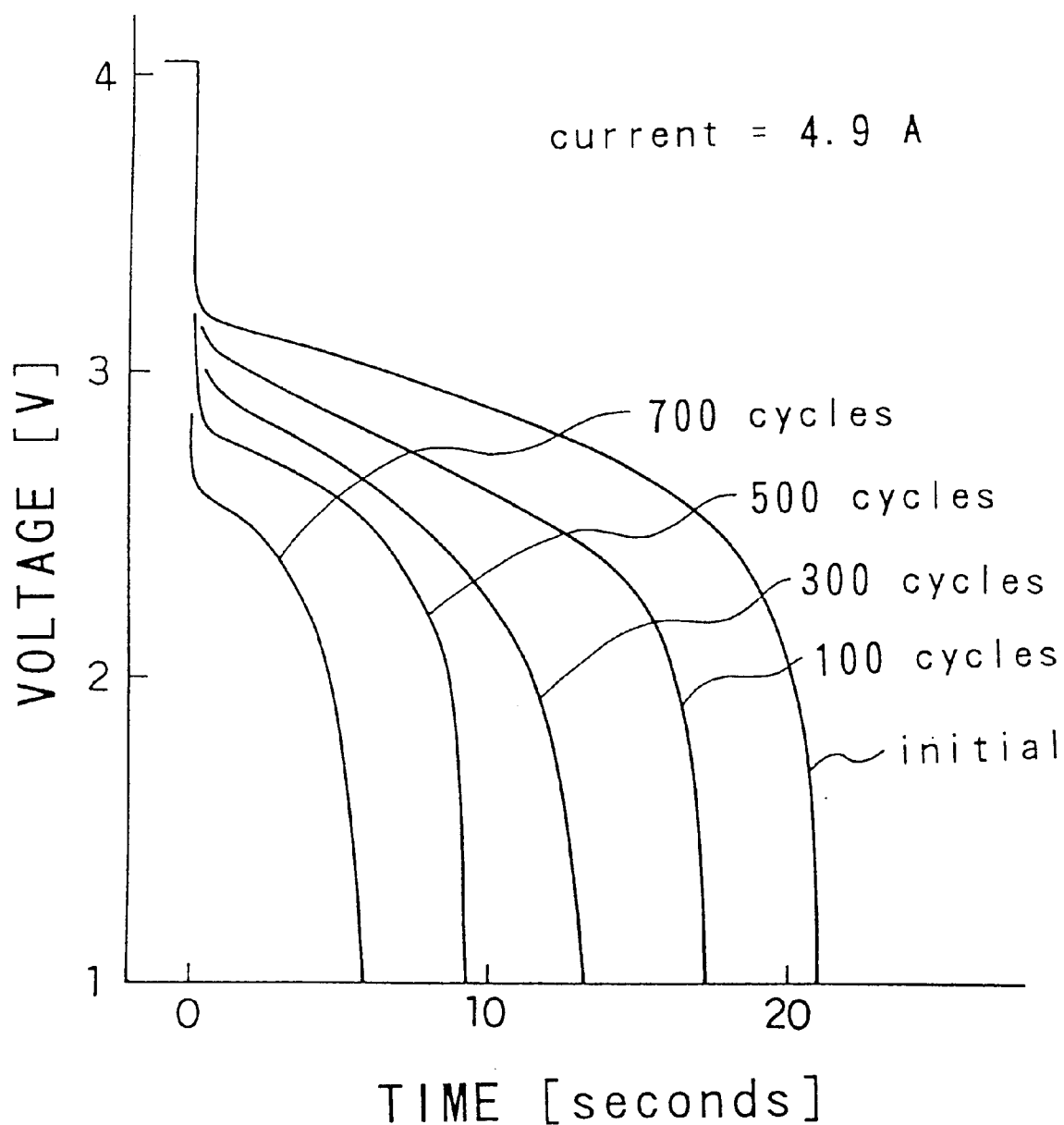
FIG. 6 shows characteristic curves illustrating changes in voltage of a battery immediately after the end of charge/discharge cycle with discharge process C when the battery is discharged at a constant current.
Figure 7:
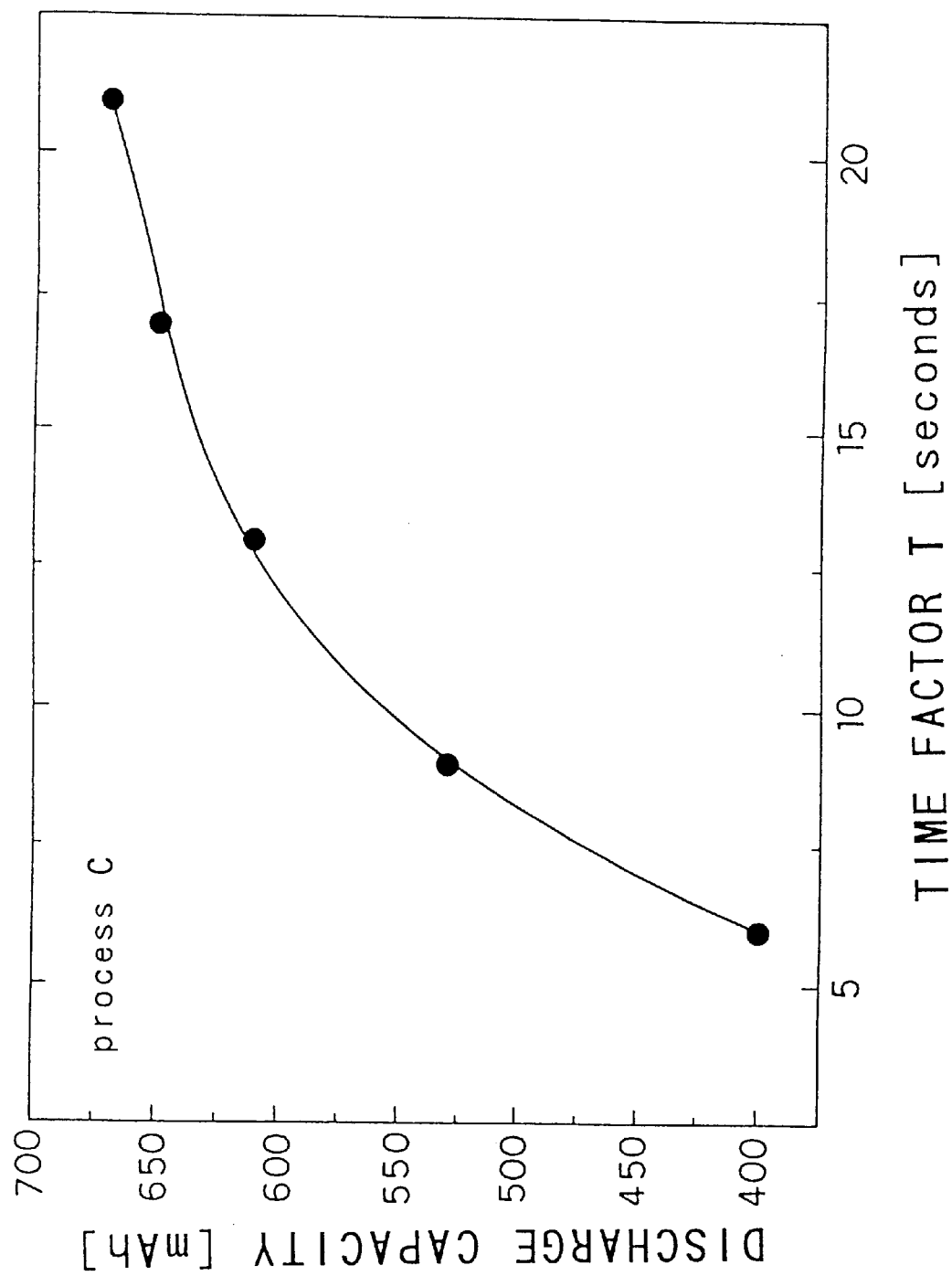
FIG. 7 shows a characteristic curve illustrating a relation between the time factor T and the discharge capacity.

As indicated in FIG. 6, the voltage drop is accelerated with the repetition of charge/discharge cycle. The time needed for the battery voltage to drop to 1.0 V was measured as time factor T. The relationship between the time factor T and the discharge capacity is shown in FIG. 7. The charge capacity can be approximated in a cubic function with the time factor T as variable.

Figure 8:
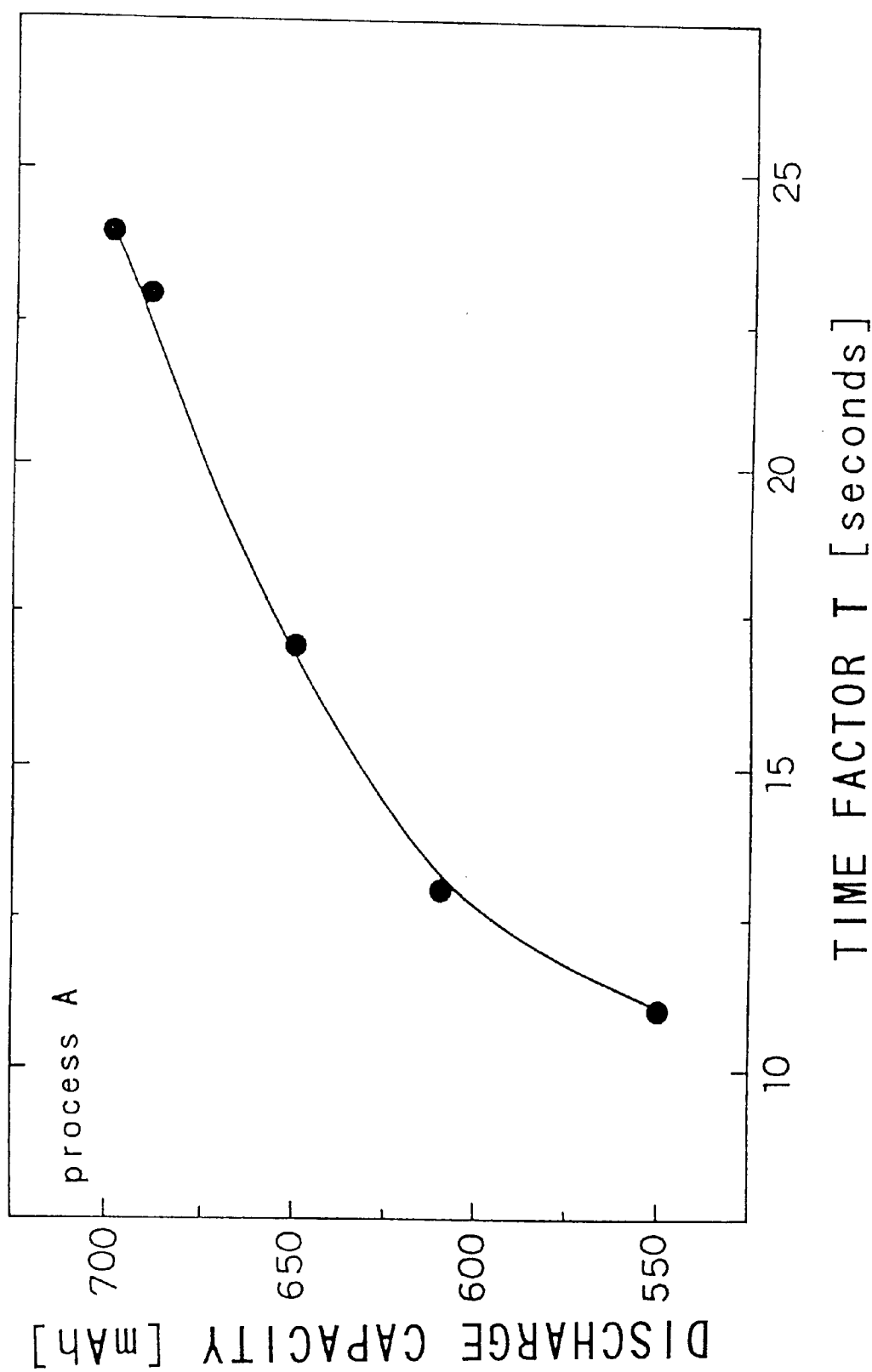
FIG. 8 is a graph illustrating a relation between the time factor T and the discharge capacity at the respective cycles of a battery which has undergone discharge process A.
Figure 9:
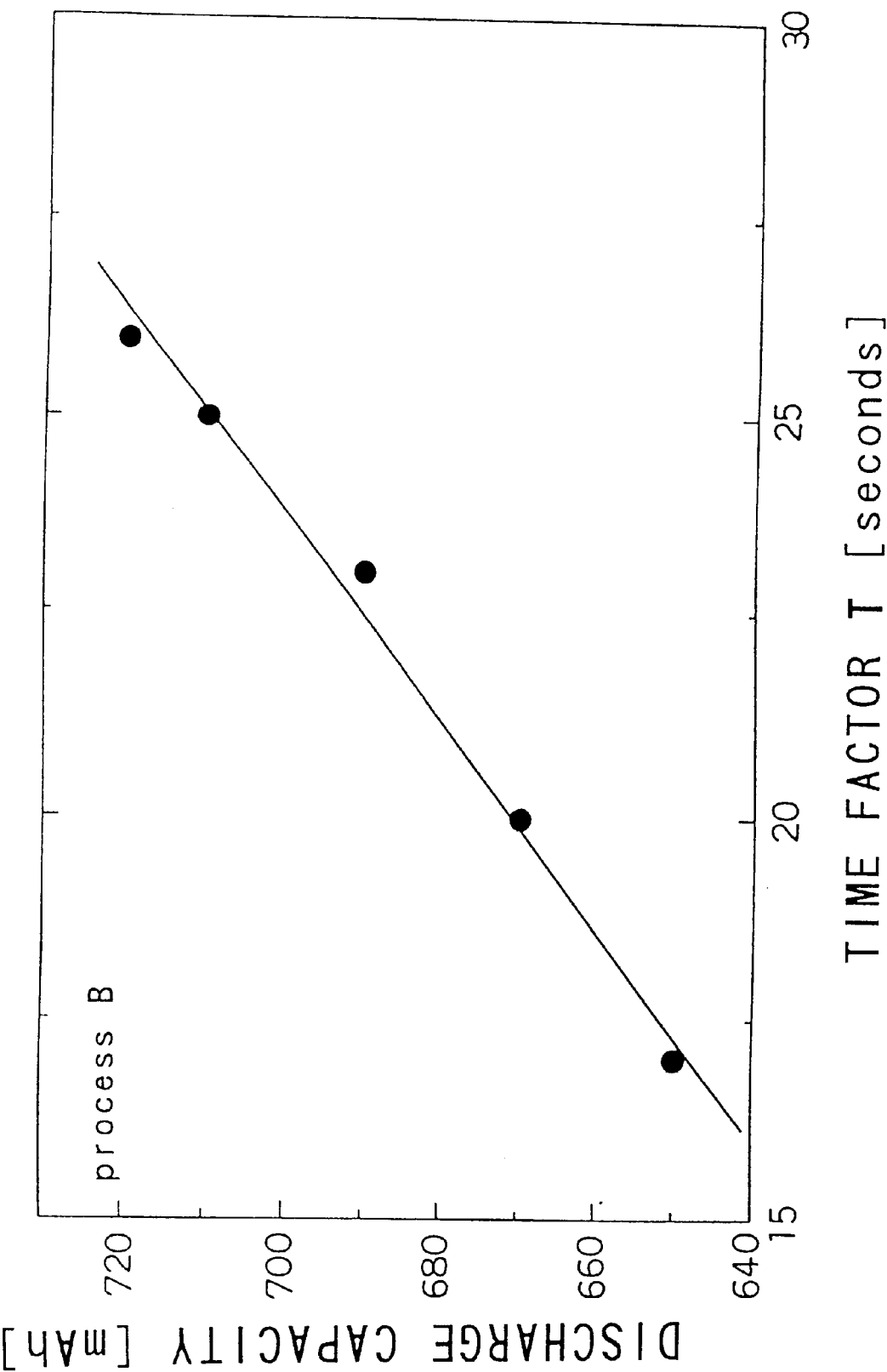
FIG. 9 is a graph illustrating a relation between the time factor T and the discharge capacity at the respective cycles of a battery which has undergone discharge process B.

The batteries discharged according to process A and process B were also examined in the same way, and the time factors T was worked out. The results are illustrated in FIG. 8 and FIG. 9.

Figure 10:
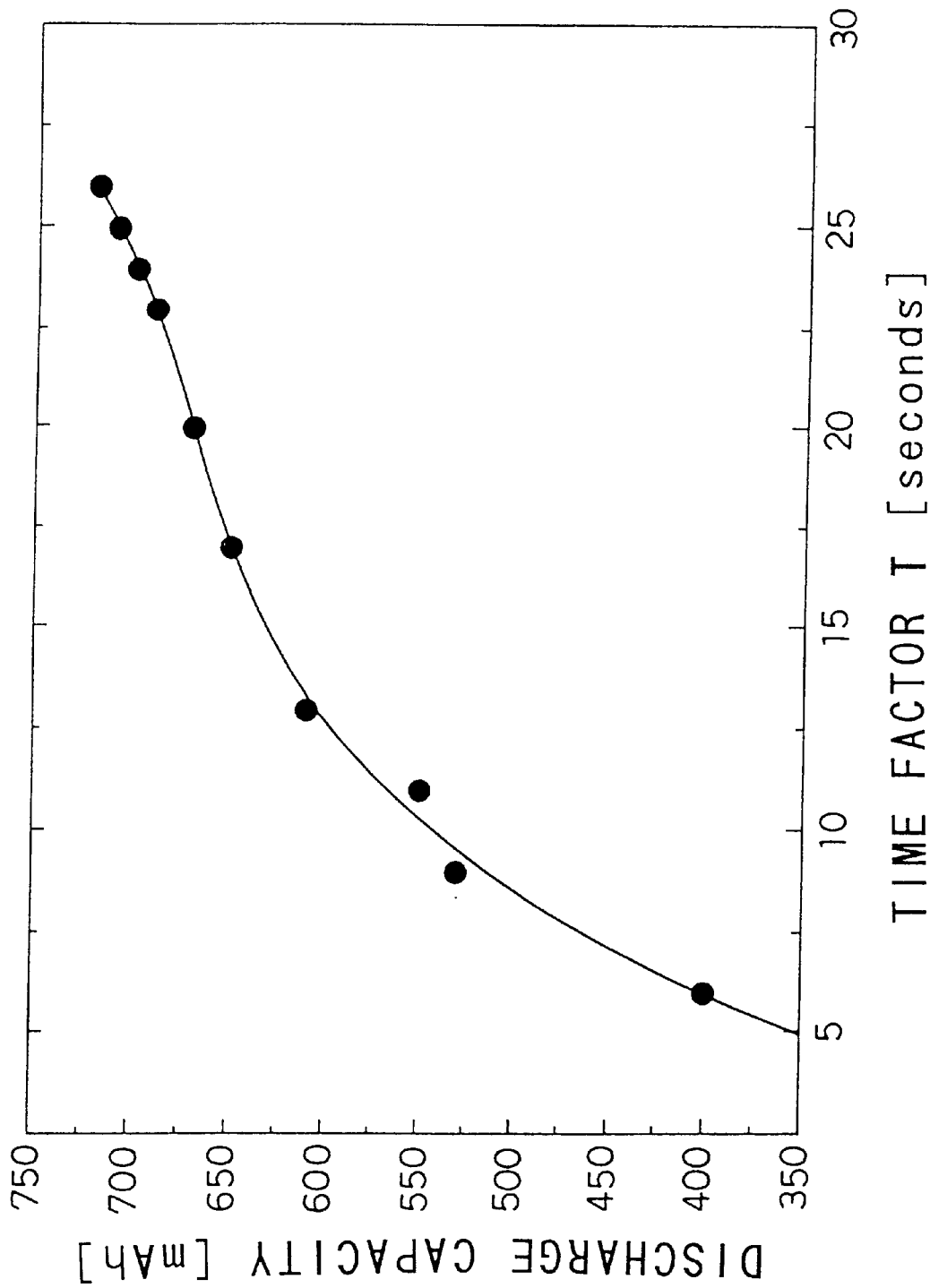
FIG. 10 is a graph illustrating a relationship between the time factor T and the discharge capacity at the respective cycles of a battery which has undergone discharge processes A, B or C.

All the data obtained were plotted in FIG. 10. The discharge capacity usually differs greatly according to the current value. Also, after repetition of charge/discharge cycle, batteries are naturally different in the degree of degradation depending on the charging and discharging conditions. As FIG. 10 indicates, however, it is possible to consistently detect the discharge capacity C or the battery performance at the moment in the following equation, even if the batteries have been undergone different charge/discharge cycles:

$$C [mAh] = aT^3 + bT^2 + cT + d$$

where a=0.066, b=−4.0, c=86, and d=19.

The equation used to estimate the discharge capacity in the present method is a cubic expression. It goes without saying that raising the dimension further and setting the parameter in more detail could improve the precision in estimating the capacity.

EMBODIMENT 3

In the present embodiment, there will be explained a method for detecting a remaining capacity of a non-aqueous electrolyte secondary battery.

In the present embodiment, the current consumption was changed to simulate an practical use of a cellular phone and the battery voltage was detected at each time when the current consumption was changed. Measurements were made in the following way.

The battery type used in this experiment was a square-shaped lithium ion battery (model No. FJA; nominal voltage of 3.6 V, nominal capacity of 600 mAh) for a cellular phone (model P201 hyper), both battery and cellular phone manufactured by Matsushita Electric Industrial Co., Ltd.

In the discharging process for the test, the discharging current was set at two modes. One is 300 mA to simulate the maximum operatable time of the cellular phone or two hours (600 mAh/2 hours=300 mA), and the other is 3.5 mA to simulate the maximum waitable time or 170 hours (600 mAh/170 hours=3.5 mA). On the assumption that the operating state in which the battery is discharged at 300 mA for 20 minutes and the waiting state in which the battery is discharged at 3.5 mA for one hour would be repeated alternately. The battery voltage was detected just before and after each 300 mA discharging.

In the detection of the battery voltage, the closed circuit voltage of battery was read out when the discharge current was temporarily changed to 60 mA for 5 seconds, while discharging the battery at 300 mA or 3.5 mA in the aforesaid process. The voltage value thus obtained was collated with a previously prepared voltage-remaining capacity correlation table, and the remaining capacity was estimated. After the voltage was detected, the discharge current value was brought back to the original level.

Now, the procedure of preparing the voltage-remaining capacity correlation table will be explained.

Figure 11:
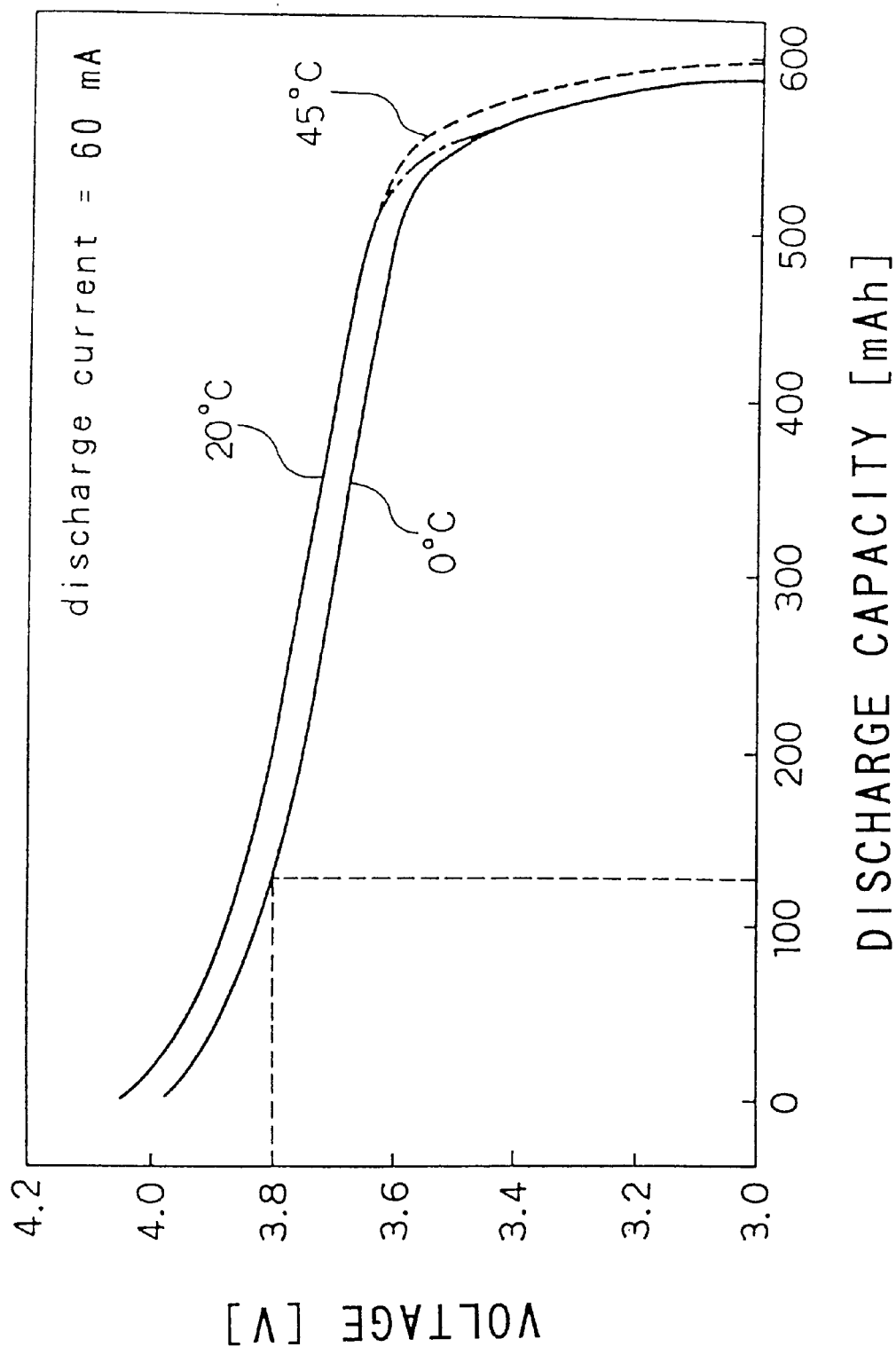
FIG. 11 is a characteristic diagram showing a discharging curve of the battery used in still another embodiment of the present invention.

FIG. 11 shows the relationship between the discharge capacity and the voltage of the battery. In FIG. 11, the batteries were previously charged for two hours at a constant current of 420 mA until the battery voltage up to 4.1 V at first, then the voltage was maintained at that level. Discharging was effected at a constant current of 60 mA at ambient temperatures of 45° C., 20° C. and 0° C.

As shown in FIG. 11, the battery voltage behaves differently according to the ambient temperature. When the battery voltage is 3.8 V, for example, the discharge capacity will be 120 mAh at the ambient temperature of 0° C., that is, the remaining capacity will be 480 mAh; and 180 mAh at an ambient temperature of 45° C., that is, the remaining capacity will be 430 mAh. This result indicates that the error in remaining capacity due to the temperature difference is (480–430) [mAh]/600 [mAh], that is about 10% of the nominal capacity. In other words, by employing the voltage-remaining capacity correlation table in which the voltage range is divided in equal ten parts each corresponding to the remaining capacity of 100%, 90%, 80%, . . . ,10% or 0 on the basis of FIG. 11, the remaining capacity of battery can be detected almost accurately without any temperature compensation.

Figure 12:
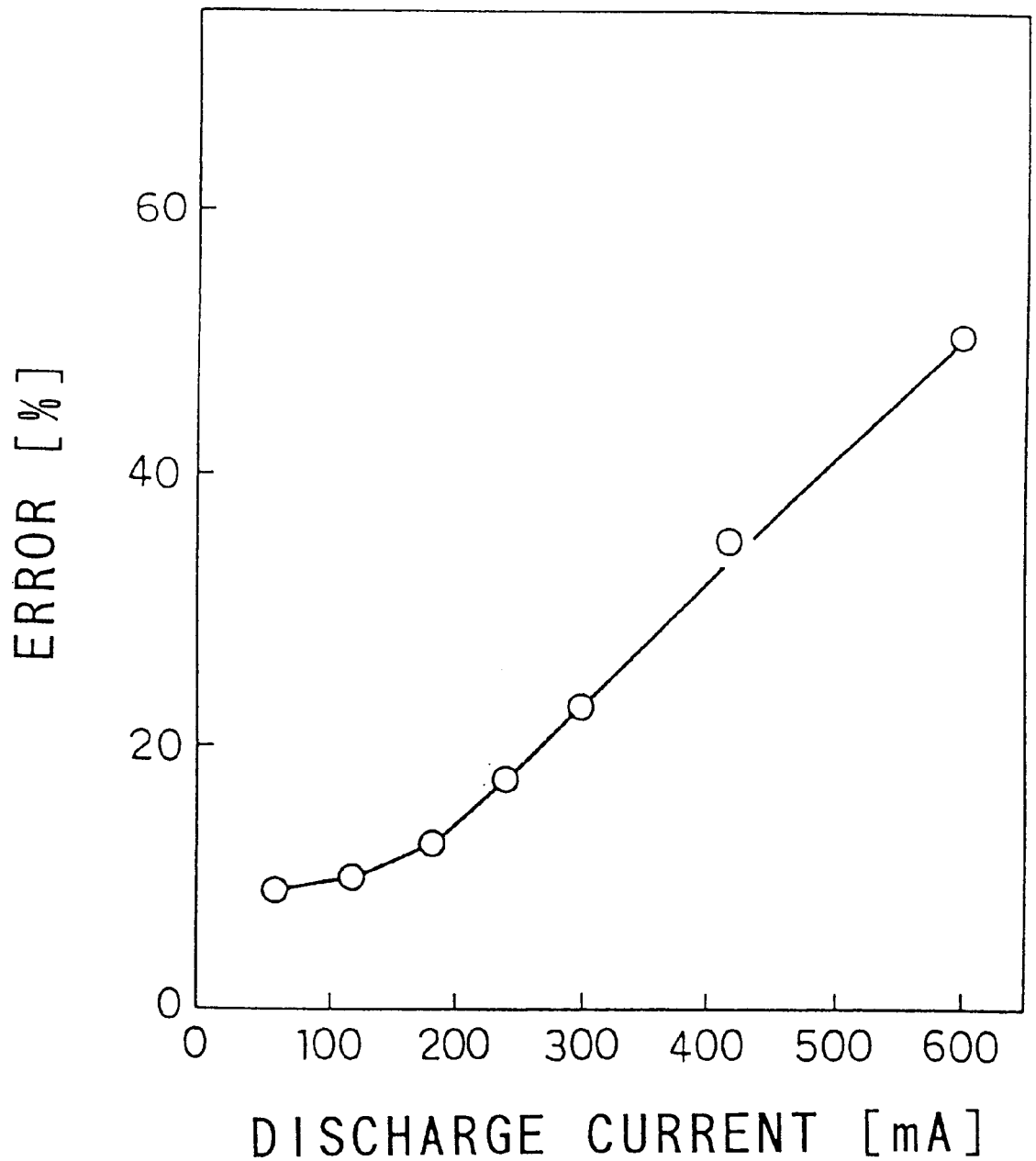
FIG. 12 is a characteristic curve showing the effects the temperature on the voltage of the battery used in the same embodiment.

As indicated above, the error caused by the temperature difference is small when the discharge current is 60 mA. But as the discharge voltage becomes larger, the error becomes considerably larger as shown in FIG. 12. In FIG. 12, the axis of abscissa denotes the discharge current, while the axis of ordinate indicates the value in percent obtained by dividing the difference between the remaining capacity at 45° C. and 0° C. when the battery voltage is 3.8 V by the nominal capacity of 600 mAh. FIG. 12 shows that when the discharge current is not higher than 120 mA or C/5 mA when the nominal capacity is C mAh, the error caused by the temperature difference is approximately 10%. But if a current larger than the above range flows, the error will increase. If the required accuracy in practical use is 10%, the current value have to be not higher than C/5 mA. Needless to say, if the temperature is monitored and the voltage is compensated with the temperature of the battery, the remaining capacity can be constantly detected with high accuracy. But that would make the battery pack large and also increase the cost of the appliance.

An experiment in detecting the remaining capacity of secondary battery was carried out in a discharge mode to simulate the use of the aforementioned cellular phone. The discharge mode is shown in FIG. 13.

In the experiment, the batteries were first charged, and then discharged for 20 minutes at 300 mA which corresponds to the current consumption in the operation mode of the phone, and for three hours at 3.5 mA which corresponds to that in the waiting mode. This combination of discharging modes was repeated. At the times $t_1$ to $t_7$ immediately after the respective discharging for 20 minutes at 300 mA, the respective batteries were discharged for 5 seconds at a constant current of 60 mA. Then the battery voltages $V_1$ to $V_7$ were measured. At the times $t_1'$ to $t_7'$ immediately after the respective discharging for 3 hours at 3.5 mA, the respective batteries were similarly discharged for 5 seconds at a constant current of 60 mA, then the battery voltages were measured. The difference between the obtained voltage value in each measurement and the value (each of $V_1$ to $V_7$) just before the respective times was about 10 mV. This cycle was repeated until the battery voltage dropped to 3.0 V. However, since the voltage of this type of battery decreases sharply after the remaining capacity falls below 10%, the final two dischargings at 300 mA was shortened to 10 minutes after that point as shown in FIG. 13 .

The behavior of the battery voltages ($V_1$ to $V_7$) in relation to the remaining capacity is shown FIG. 14. It is noted that the remaining capacity was worked out by counting back time-wise, with the remaining capacity as 0 when the battery voltage dropped to 3.0 V in FIG. 14.

From the results obtained from FIG. 14, the remaining capacities from 0 to 100% were divided into equal 10 parts with 10% range. These were matched with the voltage measurements to prepare TABLE 3.

TABLE 3

| Voltage measurement applicable range [V] | | Remaining capacity, % |
| --- | --- | --- |
| Upper limit | Lower limit | |
| — | 3.96 | 95 |
| 3.95 | 3.93 | 85 |
| 3.92 | 3.90 | 75 |
| 3.89 | 3.87 | 65 |
| 3.86 | 3.83 | 55 |
| 3.82 | 3.79 | 45 |
| 3.78 | 3.73 | 35 |
| 3.72 | 3.68 | 25 |
| 3.67 | 3.55 | 15 |
| 3.54 | 3.30 | 5 |
| 3.29 | — | not higher than 1 |

By using TABLE 3, the remaining capacity of battery can be detected with 10% unit.

The detection of remaining capacity as above can be configured by a simple arrangement.

In a practical use, if the operator presses a button for detection of remaining capacity provided in the appliance, the battery discharges at a constant current of 60 mA for a specific time, then the closed circuit voltage of the battery is measured. The voltage measurement taken is collated with the correlation table (Table 3) stored on the memory within the appliance. The remaining capacity thus obtained is then indicated on the display to the operator.

Hitherto, the remaining capacity estimation by detection of battery voltage has been done by measuring the battery voltage irrespective of the operating state of the appliance. If the discharge current changes from 300 mA to 3.5 mA, the closed circuit voltage of battery will rise about 200 mA as shown in FIG. 14. It is impossible to estimate the remaining capacity accurately just by measuring the closed circuit voltage of a discharging battery, because that differs between the operating mode and the waiting mode.

According to the present invention, the remaining capacity of battery can be estimated with precision irrespective of the operating state of the appliance by discharging the battery in a constant current as in the present embodiment. If the current consumption of the appliance in operation is smaller than the discharge current, the appliance can be used with no hindrance. In the case of the cellular phone, the operator can have a conversation. If the current consumption of the appliance in operation is larger than the discharging current at the time of voltage detection as in the embodiment, the appliance can be made operational for conversation by providing in the appliance a standby power source which is instantly chargeable and dischargeable such as an electric double-layer capacitor.

In the above embodiment, there have been described the methods of detecting the remaining capacity of a specific type of lithium ion battery. In other types of lithium ion batteries and non-aqueous electrolyte secondary batteries, the remaining capacity can be detected in the same way, if a discharge curve as FIG. 11 is prepared and the current value and the discharging (charging) time are set properly.

In a practice use, if similar correlation tables for a plural types of batteries are previously stored on the memory in the appliance and the user can select the type of battery, the remaining capacity can be detected rightly when a different battery is used.

As set forth above, the present invention can detect the degree of degradation or remaining capacity of non-aqueous electrolyte secondary battery by a simple test irrespective of the past charging and discharging history.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

We claim:

1. A method for detecting a working condition of a non-aqueous electrolyte secondary battery, wherein the working condition of the battery is quantitatively determined on the basis of a voltage value of said battery when said battery is charged or discharged at a constant current, said process comprising the steps of:

measuring the voltage values of said battery while charging or discharging said battery at a plurality of constant currents different from each other; and working out a relational expression between the voltage value and the current value by regression analysis using the voltage values obtained in the previous step and said current values, and wherein the degree of degradation of said battery is quantitatively determined on the basis of a coefficient of said relational expression.

2. The method for detecting a working condition of a non-aqueous electrolyte secondary battery in accordance with claim 1, wherein said relational expression is given by the following quadratic function in which the battery voltage V in charging or discharging at a constant current value of said battery is expressed with the current value i as variable:

$$V_o - V = ai^2 + bi + c$$

where $V_o$ is an initial voltage of said battery, and the degree of degradation of said battery is determined on the basis of the coefficient "a".

3. The method for detecting a working condition of a non-aqueous electrolyte secondary battery in accordance with claim 2, wherein the degree of degradation of said battery is determined on the basis of an estimated discharge capacity $C_a$ obtained by substituting said coefficient "a" into the equation:

$$C_a = k_1 - ak_2$$

where $k_1$ and $k_2$ are predetermined characteristic values.

4. The method for detecting a working condition of a non-aqueous electrolyte secondary battery in accordance with claim 1, wherein the degree of degradation of said battery is determined on the basis of a time T required for a voltage of said battery to reach a specific value while charging or discharging said non-aqueous electrolyte secondary battery at a large current not lower than 5 C mA when a one-hour rate nominal capacity of said battery is C mAh.

5. The method for detecting a working condition of a non-aqueous electrolyte secondary battery in accordance with claim 4, wherein the degree of degradation of said battery is determined on the basis of an estimated discharge capacity $C_b$ obtained by substituting said time T in the equation:

$$C_b = \sum_{i=1}^{n} k_i \times T^i$$

where i is a natural number of 1 to n and $k_i$ is a characteristic value previously determined by the current value, cut-off voltage and the type of battery.

6. The method for detecting a working condition of a non-aqueous electrolyte secondary battery in accordance with claim 1, wherein a remaining capacity of the battery is determined on the basis of a closed circuit voltage of said battery when said battery is charged or discharged for a specific time at a constant current value.

7. The method for detecting a working condition of a non-aqueous electrolyte secondary battery in accordance with claim 6, wherein the remaining capacity of said battery is detected by collating said closed circuit voltage with a previously prepared battery voltage-remaining capacity correlation table.

8. The method for detecting a working condition of a non-aqueous electrolyte secondary battery in accordance with claim 6, wherein said constant current value for the charging or discharging is not higher than C/5 mA when the nominal capacity of said battery is C mAh.

* * * * *